United States Patent
Li et al.

(10) Patent No.: US 12,387,914 B2
(45) Date of Patent: Aug. 12, 2025

(54) UPPER ELECTRODE ASSEMBLY

(71) Applicant: Tokyo Electron Limited, Tokyo (JP)

(72) Inventors: Lifu Li, Miyagi (JP); Takaki Kobune, Miyagi (JP); Hiroshi Tsujimoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 726 days.

(21) Appl. No.: 17/708,600

(22) Filed: Mar. 30, 2022

(65) Prior Publication Data

US 2022/0319815 A1 Oct. 6, 2022

(30) Foreign Application Priority Data

Apr. 1, 2021 (JP) .................................. 2021-062928

(51) Int. Cl.
*H01J 37/32* (2006.01)

(52) U.S. Cl.
CPC ... *H01J 37/32532* (2013.01); *H01J 2237/002* (2013.01)

(58) Field of Classification Search
None
See application file for complete search history.

(56) References Cited

U.S. PATENT DOCUMENTS

| | | | | |
|---|---|---|---|---|
| 5,074,456 A * | 12/1991 | Degner | ............... | H01J 37/3255 156/914 |
| 7,543,547 B1 * | 6/2009 | Kennedy | ........... | H01J 37/32009 118/723 R |
| 9,822,451 B2 * | 11/2017 | Blackburn | ............... | C23C 16/46 |
| 10,665,416 B2 * | 5/2020 | Kubota | .................... | H01J 37/06 |
| 2003/0184235 A1 * | 10/2003 | Nakamura | ........ | H01J 37/32009 315/111.21 |
| 2004/0221813 A1 * | 11/2004 | Chang | .................... | B82Y 30/00 118/723 E |
| 2005/0133160 A1 * | 6/2005 | Kennedy | ........... | H01J 37/32522 156/345.34 |
| 2006/0144517 A1 * | 7/2006 | Nakamura | .......... | H01J 37/3255 156/345.36 |
| 2006/0207502 A1 * | 9/2006 | Dhindsa | ............ | H01J 37/32477 118/715 |
| 2008/0090417 A1 * | 4/2008 | De La Llera | ....... | H01J 37/3255 438/689 |
| 2009/0236040 A1 * | 9/2009 | Patrick | .............. | C23C 16/45565 118/723 VE |
| 2022/0319815 A1 * | 10/2022 | Li | ..................... | H01J 37/32541 |

FOREIGN PATENT DOCUMENTS

| | | | |
|---|---|---|---|
| CN | 113594012 A | * | 11/2021 |
| JP | 2010-529303 A | | 8/2010 |
| JP | 2014-120440 A | | 6/2014 |
| JP | 2019-009270 A | | 1/2019 |
| JP | 2019-192728 A | | 10/2019 |
| WO | 2008/156958 A2 | | 12/2008 |

* cited by examiner

*Primary Examiner* — Sylvia MacArthur
(74) *Attorney, Agent, or Firm* — XSENSUS LLP

(57) ABSTRACT

An upper electrode assembly used in a plasma processing apparatus is provided. The upper electrode assembly comprises: an electrode plate; a metal plate; and a heat transfer sheet disposed between the electrode plate and the metal plate and having a vertically oriented portion. The vertically oriented portion has a plurality of vertically oriented graphene structures oriented along a vertical direction.

16 Claims, 9 Drawing Sheets

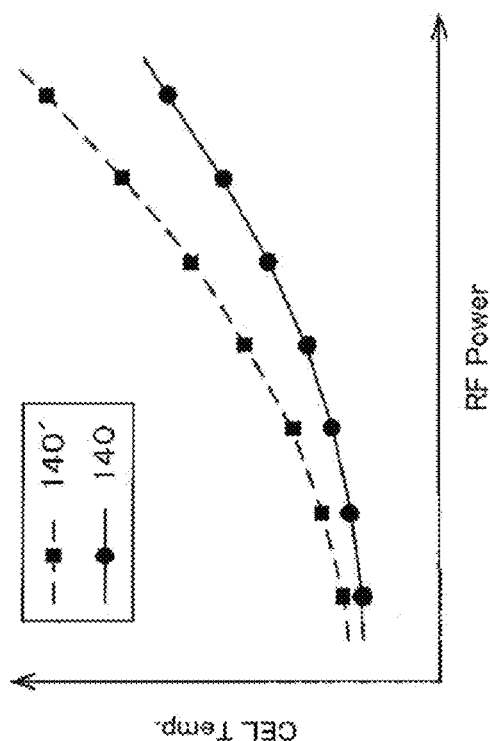
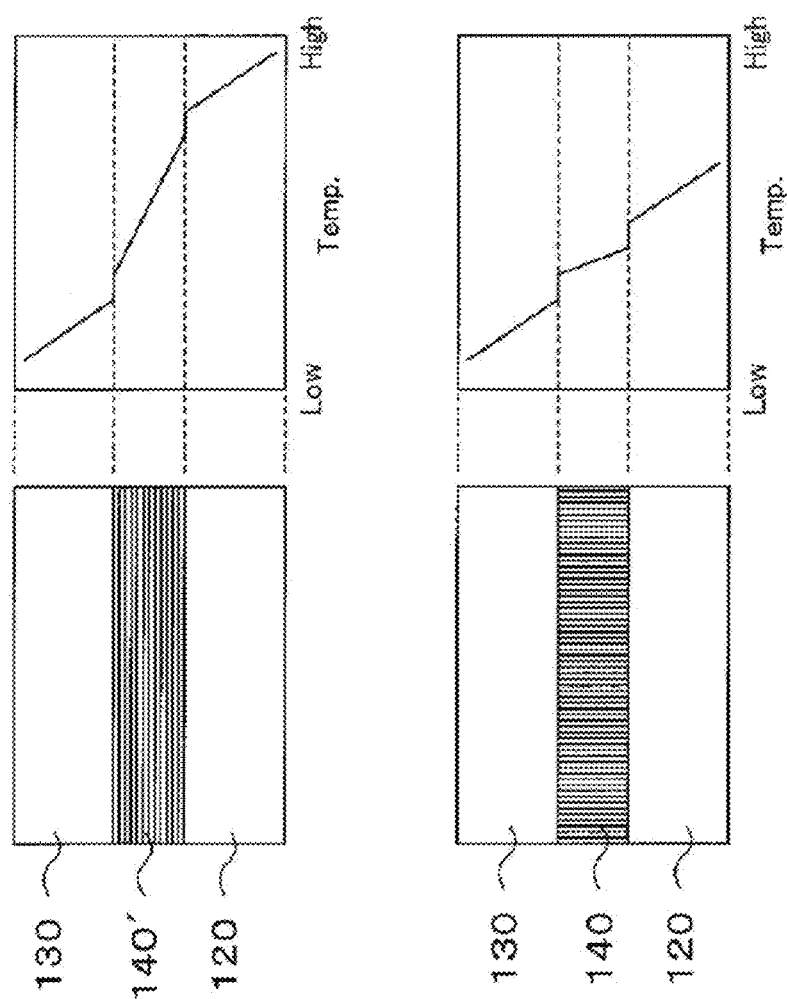
FIG. 7

UPPER ELECTRODE ASSEMBLY

CROSS-REFERENCE TO RELATED APPLICATIONS

This application claims priority to Japanese Patent Application No. 2021-062928, filed on Apr. 1, 2021, the entire contents of which are incorporated herein by reference.

TECHNICAL FIELD

The present disclosure relates to an upper electrode assembly.

BACKGROUND

Japanese Patent Application Publication No. 2014-120440 discloses an electrode unit disposed in a substrate processing apparatus including a processing chamber for processing a substrate using plasma. The electrode unit described in Japanese Patent Application Publication No. 2014-120440 has an electrode layer, a heating layer, and a cooling layer arranged in that order from the processing chamber side. The heating layer completely covers the electrode layer. The cooling layer completely covers the electrode layer with the heating layer interposed therebetween. A heat transfer sheet is disposed between the heating layer and the cooling layer.

SUMMARY

The technique of the present disclosure provides an upper electrode assembly capable of appropriately improving a heat transfer efficiency in a thickness direction.

To this end, an upper electrode assembly used in a plasma processing apparatus provided, the assembly comprising: an electrode plate; a metal plate; and a heat transfer sheet disposed between the electrode plate and the metal plate and having a vertically oriented portion, wherein the vertically oriented portion has a plurality of vertically oriented graphene structures oriented along a vertical direction.

BRIEF DESCRIPTION OF THE DRAWINGS

The objects and features of the present disclosure will become apparent from the following description of embodiments, given in conjunction with the accompanying drawings, in which:

FIG. 7 explains the heat transfer performance of the heat transfer sheet;

DETAILED DESCRIPTION

Figure 1:
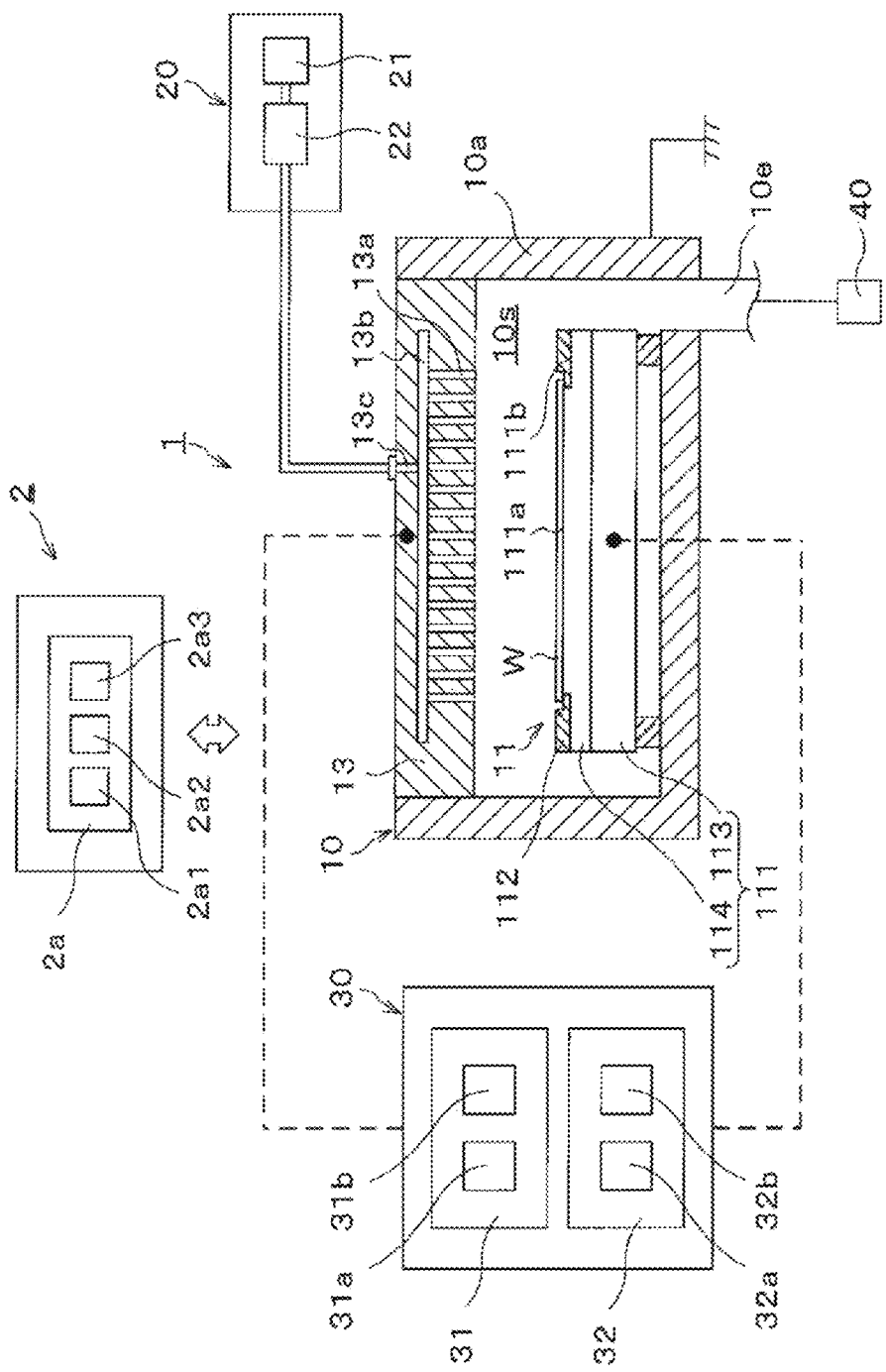
FIG. 1 is a vertical cross-sectional view showing a configuration of a plasma processing system according to an embodiment.

In a semiconductor device manufacturing process, plasma is produced by exciting a processing gas supplied to a chamber, and various plasma processings, such as etching, film formation, diffusion, and the like, are performed on a semiconductor substrate (hereinafter, simply referred to as "substrate") supported by a substrate support. Such plasma processings are performed by, e.g., a capacitively coupled plasma (CCP) processing apparatus including an upper electrode assembly constituting a part of a ceiling portion of the chamber.

Here, in a recent semiconductor device manufacturing process, along with a demand for miniaturization of a pattern formed on a substrate surface, it is required to perform high-speed switching (e.g., ON/OFF switching) of a radio frequency (RF) power supply with a high output in a plasma processing apparatus. However, in the case of performing the high-speed switching of the RF power supply with a high output, a heat input from plasma to the upper electrode assembly disposed adjacent to a plasma processing space varies, so that a temperature of the upper electrode assembly may vary.

When the temperature of the upper electrode assembly varies, the distribution of plasma processing results on a substrate may not be uniform. Therefore, in order to control the plasma processing results to be uniform throughout the substrate, it is necessary to control the temperature of the upper electrode assembly in response to the variation of the heat input from the plasma.

The above-described Japanese Patent Application Publication No. 2014-120440 discloses that the temperature of the electrode layer of the electrode unit is controlled by the heating layer or the cooling layer disposed in the electrode unit. Further, in accordance with Japanese Patent Application Publication No. 2014-120440, a heat transfer layer (e.g., a heat transfer sheet) is disposed between the heating layer and the cooling layer, so that the cooling layer effectively cools the electrode layer.

In the electrode unit disclosed in Japanese Patent Application Publication No. 2014-120440, the heat transfer in a plane direction (horizontal direction) is mainly promoted depending on the heat transfer layer disposed between the heating layer and the cooling layer, and, thus, the temperature of the entire electrode layer is appropriately controlled. However, when the high-speed switching of the RF power supply is performed with a high output as described above, it is important to process an instantaneous heat input from the plasma as quickly as possible. In other words, it is important to minimize a thermal resistance of the electrode unit in a vertical direction (thickness direction). From this perspective, the conventional electrode unit needs to be improved, and it is required to develop an electrode unit having an improved heat transfer performance especially in the vertical direction.

In view of the above, the technique of the present disclosure provides an upper electrode assembly capable of appropriately improving the heat transfer efficiency in the thickness direction. Hereinafter, a plasma processing system including the upper electrode assembly according to the present embodiment will be described with reference to the accompanying drawings. Like reference numerals will be used for like parts having substantially the same functions throughout this specification and the drawings, and redundant description thereof will be omitted.

<Plasma Processing Apparatus>

First, the plasma processing system according to the present embodiment will be described. FIG. 1 is a vertical cross-sectional view showing a schematic configuration of the plasma processing system according to the present embodiment.

The plasma processing system includes a capacitively coupled plasma processing apparatus 1 and a controller 2. The plasma processing apparatus 1 includes a plasma processing chamber 10, a gas supply 20, a power supply 30, and an exhaust system 40. Further, the plasma processing apparatus 1 includes a substrate support 11 and a gas introduction unit. The substrate support 11 is disposed in the plasma processing chamber 10. The gas introduction unit is configured to introduce at least one processing gas into the plasma processing chamber 10. The gas introduction unit includes an upper electrode assembly 13. The upper electrode assembly 13 is disposed above the substrate support 11. In one embodiment, the upper electrode assembly 13 constitutes at least a part of a ceiling of the plasma processing chamber 10. The plasma processing chamber 10 has a plasma processing space 10s defined by the upper electrode assembly 13, sidewalls 10a of the plasma processing chamber 10, and the substrate support 11. The plasma processing chamber 10 has at least one gas inlet for supplying at least one processing gas to the plasma processing space 10s and at least one gas outlet for exhausting gases from the plasma processing space 10s. The sidewalls 10a are grounded. The upper electrode assembly 13 and the substrate support 11 are electrically insulated from the plasma processing chamber 10.

The substrate support 11 includes a main body 111 and a ring assembly 112. An upper surface of the main body 111 has a central region 111a (substrate supporting surface) for supporting the substrate (wafer) W and an annular region 111b (ring supporting surface) for supporting the ring assembly 112. The annular region 111b surrounds the central region 111a in plan view. The ring assembly 112 includes one or more annular members, and at least one of them is an edge ring.

In one embodiment, the main body 111 includes a base 113 and an electrostatic chuck 114. The base 113 includes a conductive member. The conductive member of the base 113 functions as a lower electrode. The electrostatic chuck 114 is disposed on an upper surface of the base 113. The upper surface of the electrostatic chuck 114 has the above-described central region 111a and annular region 111b.

Although not shown, the substrate support 11 may include a temperature control module configured to control at least one of the ring assembly 112, the electrostatic chuck 114, and the substrate W to a target temperature. The temperature control module may be a heater, a heat transfer medium, a flow passage, or a combination thereof. A heat transfer fluid, such as brine and gas, flows into the flow passage. The substrate support 11 may include a heat transfer gas supply configured to supply a heat transfer gas (backside gas) to a gap between the backside of the substrate W and an upper surface of the electrostatic chuck 114.

Figure 2:
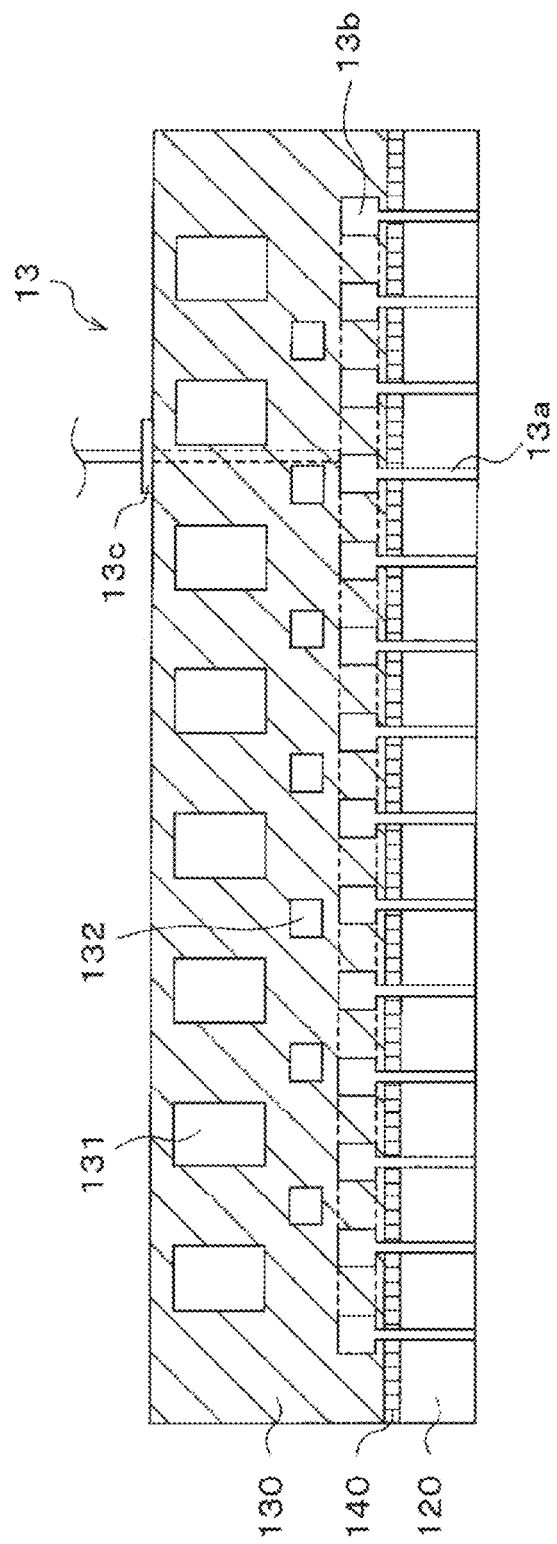
FIG. 2 is a vertical cross-sectional view showing a configuration of an upper electrode assembly according to an embodiment.

As shown in FIG. 2, in one embodiment, the upper electrode assembly 13 includes an electrode plate 120 and a metal plate 130. The electrode plate 120 and the metal plate 130 are laminated in a vertical direction with a heat transfer sheet 140 interposed therebetween. In other words, in the upper electrode assembly 13, the electrode plate 120, the heat transfer sheet 140, and the metal plate 130 are laminated in that order from the plasma processing space 10s side.

The electrode plate 120 includes a conductive member, such as aluminum or the like. The conductive member of the electrode plate 120 functions as an upper electrode. A plurality of gas inlet ports 13a are formed through the electrode plate 120 in the thickness direction (vertical direction). The gas inlet ports 13a are connected to the gas supply 20 through a gas diffusion space 13b and a gas supply port 13c formed in the metal plate 130 to be described later, and are configured to introduce at least one processing gas from the gas supply 20 into the plasma processing space 10s.

The metal plate 130 is laminated on the electrode plate 120, and functions as a support for the electrode plate 120. At least one gas diffusion space 13b and at least one gas supply port 13c are formed in the metal plate 130. The gas diffusion space 13b and the gas supply port 13c are connected to the gas supply 20, and are configured to introduce at least one processing gas from the gas supply 20 into the plasma processing space 10s through the gas inlet ports 13a formed in the electrode plate 120, as described above.

Further, the metal plate 130 has therein at least one coolant flow passage 131 and at least one heating module 132 configured to control the electrode plate 120 whose temperature varies due to the heat input from the plasma to a target temperature. A heat transfer fluid, such as brine or gas, flows through the coolant flow passage 131. The heating module 132 may be a heater, a heat transfer medium, a flow passage, or a combination thereof. Further, in one embodiment, the coolant flow passage 131 and the heating module 132 are arranged in the metal plate 130 without overlapping in the vertical direction (in plan view), and are configured such that they do not interfere with each other when heat is transferred between the electrode plate 120 and the metal plate 130.

Figure 3:
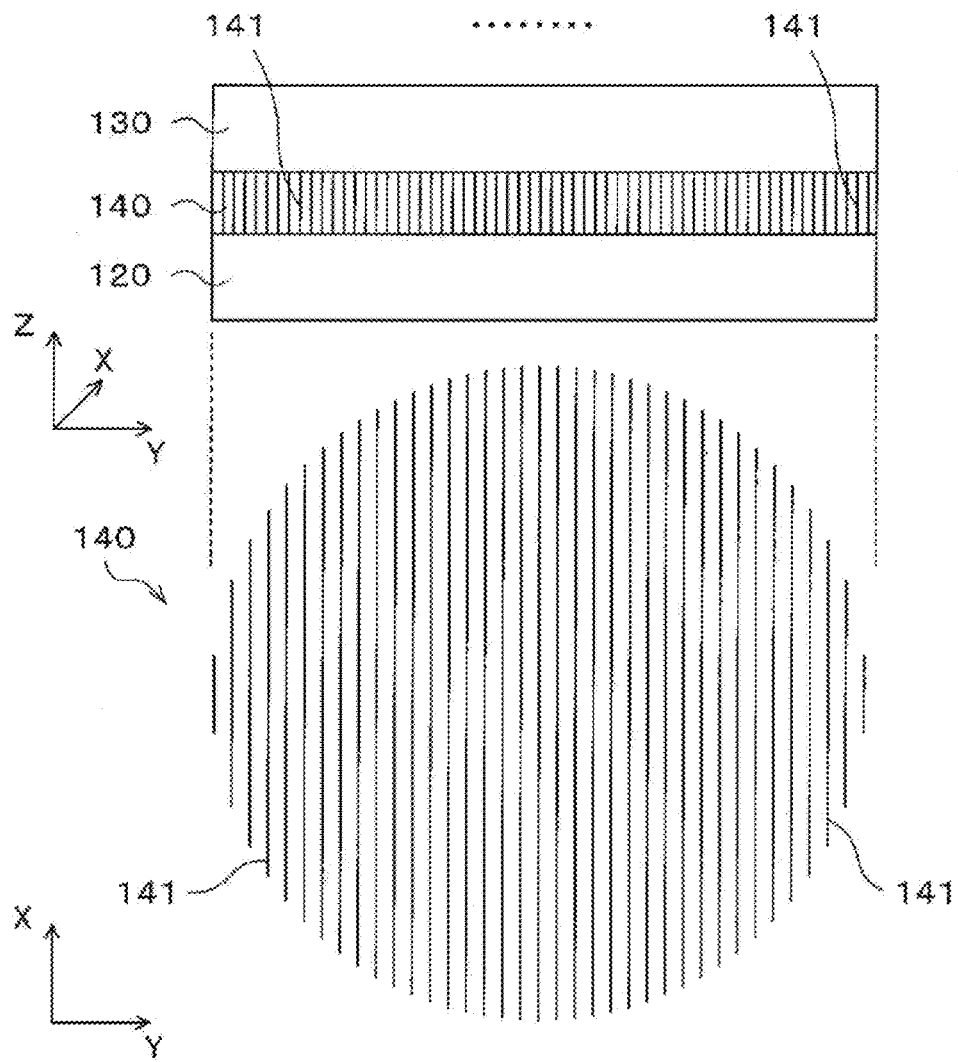
FIG. 3 is a cross-sectional view showing a configuration of a heat transfer sheet according to an embodiment.
Figure 4:
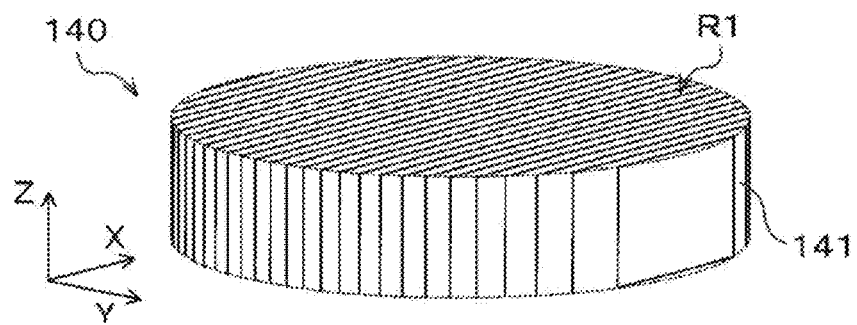
FIG. 4 is a perspective view showing the configuration of the heat transfer sheet according to the embodiment.
Figure 5:
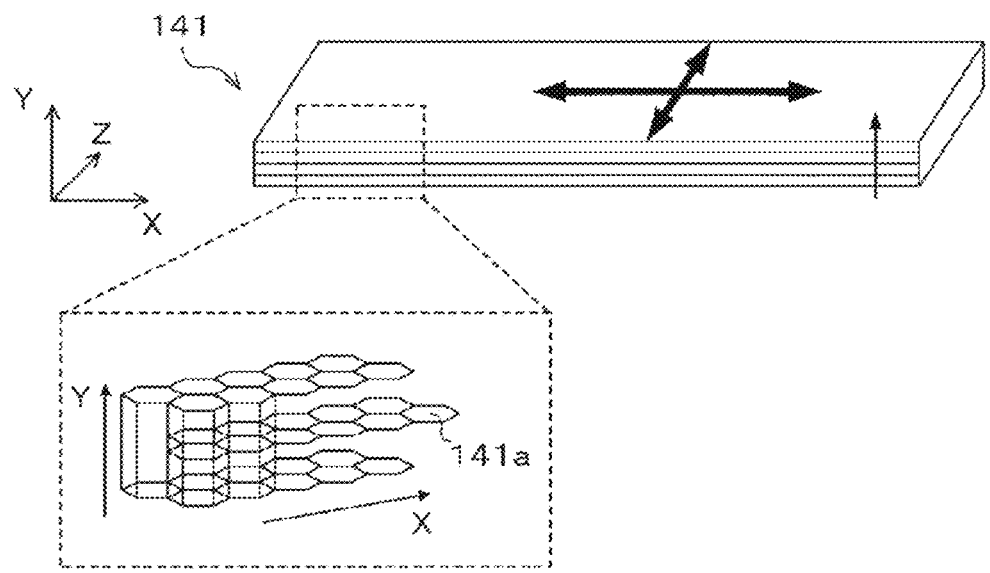
FIG. 5 explains a heat transfer performance of the heat transfer sheet.

As shown in FIGS. 3 and 4, in one embodiment, the heat transfer sheet 140 has a vertically oriented portion R1. The vertically oriented portion R1 forms a partial region or the entire region of the heat transfer sheet 140. In one embodiment, the vertically oriented portion R1 is formed in a partial region or the entire region of the heat transfer sheet 140 in the horizontal direction. In one embodiment, the vertically oriented portion R1 is formed in a partial region or the entire region of the heat transfer sheet 140 in the vertical direction. Here, the partial region may be one region, or may be a plurality of regions. The vertically oriented portion R1 is formed by laminating a plurality of graphite sheets 141 having heat transfer anisotropy in the plane direction (horizontal direction). Further, as shown in FIG. 5, each of the graphite sheets 141 has a plurality of graphene structures 141a oriented along the plane direction (i.e., the vertical direction) of the graphite sheet 141. In other words, in one embodiment, the heat transfer sheet 140 has the plurality of graphene structures (a plurality of vertically oriented graphene structures) 141a oriented along the vertical direction (Z-direction) that is the lamination direction of the electrode plate 120 and the metal plate 130.

Here, the thermal conductivity in the orientation directions (X-direction and Z-direction) of the graphene structures 141a is higher than the thermal conductivity in the lamination direction (Y-direction) of the graphene structures 141a. In other words, in one embodiment, the heat transfer sheet 140 is disposed such that the thermal conductivity in the vertical direction (Z-direction in FIG. 4) and the one plane direction (X direction in FIG. 4), which are the orientation directions of the graphene structures 141a, becomes higher than the thermal conductivity in the lamination direction of the graphene structures 141a, i.e., in the other plane direction (Y-direction in FIG. 4) orthogonal to the one plane direction.

In the upper electrode assembly 13, the temperature control in response to the variation of the temperature of the electrode plate 120 can be appropriately performed simply by inserting a heat transfer sheet formed by laminating graphite sheets having high thermal conductivity between the electrode plate 120 and the metal plate 130. However, in the present embodiment, as shown in FIGS. 3 and 4, the heat transfer sheet 140 is formed by laminating the plurality of graphite sheets 141 in the plane direction (horizontal direction) such that the plurality of graphene structures 141a are oriented along the vertical direction. Accordingly, the heat transfer efficiency in the vertical direction can be improved compared to a heat transfer sheet 140' (see FIG. 7 to be described later) formed by horizontally laminating the plurality of graphite sheets 141. In other words, the temperature of the electrode plate 120 can be controlled more appropriately.

In the following description, as shown in FIG. 4, a portion of the heat transfer sheet 140 where the plurality of graphene structures 141a are oriented along the vertical direction may be referred to as "vertically oriented portion R1". In other words, in the vertically oriented portion R1 of the heat transfer sheet 140, the thermal conductivity in the vertical direction is higher than the thermal conductivity in the plane direction.

In one example, in the graphite sheet 141, the thermal conductivity in the orientation direction of the graphene structures 141a is 2000 W/m·K, and the thermal conductivity in the lamination direction of the graphene structures 141a is 10 W/m·K.

The gas introduction unit may include, in addition to the upper electrode assembly 13, one or more side gas injectors (SGI) attached to one or more openings formed in the sidewall 10a.

Referring back to FIG. 1, the gas supply 20 may include at least one gas source 21 and at least one flow rate controller 22. In one embodiment, the gas supply 20 is configured to supply at least one processing gas from the corresponding gas source 21 through the corresponding flow rate controller 22 into the upper electrode assembly 13. Each flow rate controller 22 may be, for example, a mass flow controller or pressure-controlled flow rate controller. The gas supply 20 may include one or more flow modulation devices for modulating the flow rate of at least one processing gas or causing it to be pulsed.

The power supply 30 includes an RF power supply 31 connected to the plasma processing chamber 10 through at least one impedance matching circuit. The RF power supply 31 is configured to supply at least one RF signal (RF power), such as a source RF signal and a bias RF signal, to the conductive member (lower electrode) of the substrate support 11 and/or the conductive member (upper electrode) of the upper electrode assembly 13. Accordingly, plasma is produced from at least one processing gas supplied into the plasma processing space 10s. Hence, the RF power supply 31 may function as at least part of a plasma generator configured to generate plasma from one or more treated gases in the plasma processing chamber 10. Further, by supplying the bias RF signal to the lower electrode, a bias potential is generated at the substrate W, and ions in the produced plasma can be attracted to the substrate W.

In one embodiment, the RF power supply 31 includes a first RF generator 31a and a second RF generator 31b. The first RF generator 31a is connected to the lower electrode and/or the upper electrode through at least one impedance matching circuit and is configured to generate a source RF signal (source RF power) for plasma generation. In one embodiment, the source RF signal has a frequency within a range of 13 MHz to 160 MHz. In one embodiment, the first RF generator 31a may be configured to generate multiple source RF signals having different frequencies. The generated one or multiple source RF signals are supplied to the lower electrode and/or the upper electrode. The second RF generator 31b is connected to the lower electrode through at least one impedance matching circuit and is configured to generate a bias RF signal (bias RF power). In one embodiment, the bias RF signal has a frequency lower than that of the source RF signal. In one embodiment, the bias RF signal has a frequency within a range of 400 kHz to 13.56 MHz. In one embodiment, the second RF generator 31b may be configured to generate multiple bias RF signals having different frequencies. The generated one or multiple bias RF signals are supplied to the lower electrode. In various embodiments, at least one of the source RF signal and the bias RF signal may be pulsed.

The power supply 30 may also include a DC power supply 32 connected to the plasma processing chamber 10. The DC source 32 includes a first DC generator 32a and a second DC generator 32b. In one embodiment, the first DC generator 32a is connected to the lower electrode and is configured to generate a first DC signal. The generated first bias DC signal is applied to the lower electrode. In one embodiment, the first DC signal may be applied to another electrode, such as an attracting electrode in the electrostatic chuck 114. In one embodiment, the second DC generator 32b is connected to the upper electrode and is configured to generate a second DC signal. The generated second DC signal is applied to the upper electrode. In various embodiments, at least one of the first and second DC signals may be pulsed. The first and second DC generator 32a and 32b may be provided in addition to the RF power source 31, or the first DC generator 32a may be provided instead of the second RF generator 31b.

The exhaust system 40 may be connected to a gas outlet 10e disposed at a bottom portion of the plasma processing chamber 10, for example. The exhaust system 40 may include a pressure control valve and a vacuum pump. The pressure control valve adjusts the pressure in the plasma processing space 10s. The vacuum pump may be a turbo molecular pump, a dry pump, or a combination thereof.

The controller 2 processes computer-executable instructions that cause the plasma processing apparatus 1 to perform the various steps described in the present disclosure. The controller 2 may be configured to control individual components of the plasma processing apparatus 1 to perform various steps described herein. In one embodiment, the controller 2 may be partially or entirely included in the plasma processing apparatus 1. The controller 2 may include, e.g., a computer 2a. The computer 2a may include, e.g., a central processing unit (CPU) 2a1, a storage device 2a2, and a communication interface 2a3. The central processing unit 2a1 may be configured to perform various operations based on a program stored in the storage device 2a2. The storage device 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

While various embodiments have been described above, the present disclosure is not limited to the above-described embodiments, and various additions, omissions, substitutions and changes may be made. Further, other embodiments can be implemented by combining elements in different embodiments.

Figure 6:
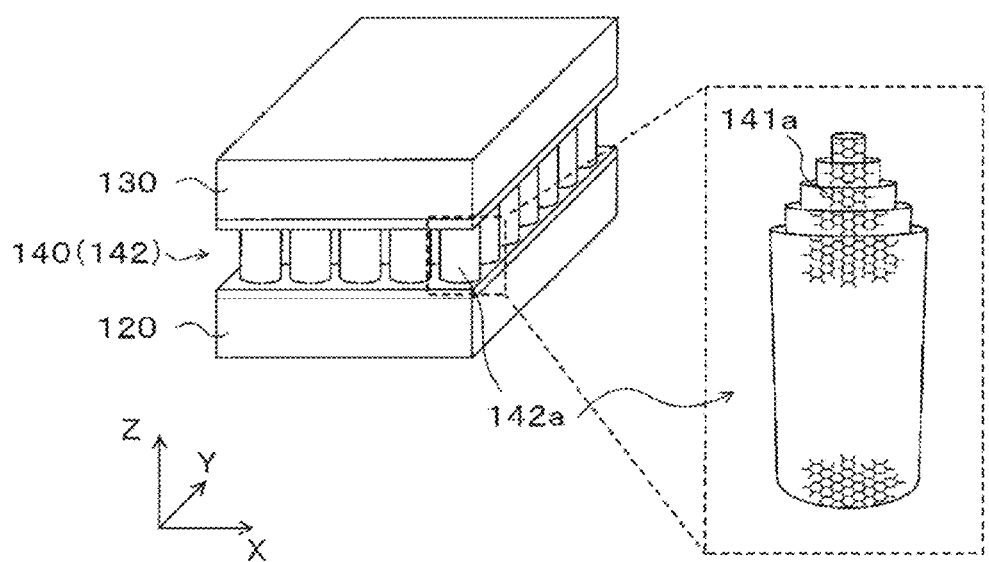
FIG. 6 explains another configuration example of the heat transfer sheet.

For example, in the above embodiment, in the heat transfer sheet 140 of the upper electrode assembly 13, the vertically oriented portion R1 is formed by laminating the plurality of vertically oriented graphite sheets 141 in the plane (horizontal) direction, so that the plurality of vertically oriented graphene structures 141a are oriented along the vertical direction. However, the configuration of the heat transfer sheet 140 is not limited thereto, and the vertically oriented portion R1 may be formed by a vertically oriented carbon nanotube (CNT) sheet 142 having a plurality of carbon nanotubes 142a extending along the thickness direction (vertical direction) as shown in FIG. 6. As shown in FIG. 6, the vertically oriented carbon nanotube 142a has a plurality of vertically oriented graphene structures 141a oriented along the extension direction of the vertically oriented carbon nanotube 142a. In other words, each of the vertically oriented carbon nanotubes 142a has the plurality of vertically oriented graphene structures 141a. In other words, in one embodiment, in the vertically oriented portion R1 of the heat transfer sheet 140, the thermal conductivity in the vertical direction, which is the extension direction of the vertically oriented carbon nanotube 142a (the orientation direction of the vertically oriented graphene structures 141a), is higher than the thermal conductivity in the plane (horizontal) direction.

<Substrate Processing Method Performed by Plasma Processing Apparatus>

Next, an example of a method for processing the substrate W in the plasma processing apparatus 1 configured as described above will be described. In the plasma processing apparatus 1, various plasma processings, such as etching, film formation, diffusion, and the like, are performed on the substrate W.

First, the substrate W is loaded into the plasma processing chamber 10 and placed on the electrostatic chuck 114 of the substrate support 11. Next, a voltage is applied to the attracting electrode of the electrostatic chuck 114, so that the substrate W is attracted and held on the electrostatic chuck 114 by an electrostatic force.

When the substrate W is attracted and held on the electrostatic chuck 114, the plasma processing chamber 10 is depressurized to a predetermined vacuum level. Next, the processing gas is supplied from the gas supply 20 to the plasma processing space 10s via the upper electrode assembly 13. Further, the source RF power for plasma generation is supplied from the first RF generator 31a to the lower electrode. Accordingly, the processing gas is excited, and plasma is generated. In this case, the bias RF power may be supplied from the second RF generator 31b. Then, in the plasma processing space 10s, the substrate W is subjected to plasma processing by the action of the generated plasma.

Here, during the plasma processing of the substrate W, the temperature of the electrode plate 120 of the upper electrode assembly 13 disposed adjacent to the plasma processing space 10s varies due to the heat input from the plasma. When the temperature of the electrode plate 120 varies, the plasma processing result may be non-uniform in the plane of the substrate W.

Therefore, in the present embodiment, the temperature of the electrode plate 120 is controlled by the coolant flow passage 131 and the heating module 132 in response to the variation of the temperature of the electrode plate 120. Specifically, for example, when the temperature of the electrode plate 120 increases due to the heat input from the plasma, the temperature of the metal plate 130 is lowered by circulating a heat transfer fluid in the coolant flow passage 131. Accordingly, the heat transfer from the electrode plate 120 to the metal plate 130 is promoted, thereby lowering the temperature of the electrode plate 120.

Here, in the upper electrode assembly 13 according to the present embodiment, the heat transfer sheet 140 having the vertically oriented portion R1 is inserted between the electrode plate 120 and the metal plate 130. As described above, the plurality of vertically oriented graphene structures 141a are oriented along the vertical direction in the vertically oriented portion R1, so that the thermal conductivity in the vertical direction is higher than the thermal conductivity in the plane (horizontal) direction. Accordingly, in the present embodiment, the heat transfer in the vertical direction, which is the lamination direction of the electrode plate 120 and the metal plate 130, is promoted. In other words, the temperature of the electrode plate 120 can be effectively controlled. Further, when the heat transfer sheet 140 is inserted between the electrode plate 120 and the metal plate 130, a load may be applied to the heat transfer sheet 140 in order to obtain a desired contact pressure. As the contact pressure increases, the thermal contact resistance decreases, which makes it possible to obtain a higher heat transfer performance.

When the plasma processing is completed, the supply of the source RF power from the first RF generator 31a and the supply of the processing gas from the gas supply 20 are stopped. In the case of supplying the bias RF power during the plasma processing, the supply of the bias RF power is also stopped.

Next, the attraction and holding of the substrate W on the electrostatic chuck 114 is stopped, and the substrate W that has been subjected to the plasma processing and the electrostatic chuck 114 are neutralized. Then, the substrate W is separated from the electrostatic chuck 114 and taken out from the plasma processing apparatus 1. In this manner, a series of plasma processing is completed.

<Operation and Effect of the Upper Electrode Assembly of the Present Disclosure>

As described above, in accordance with the upper electrode assembly of the present embodiment, the heat transfer sheet 140 having the vertically oriented portion R1 is inserted between the electrode plate 120 disposed adjacent to the plasma processing space 10s and the metal plate 130 laminated on the electrode plate 120 and having therein the coolant flow passage 131 and the heating module 132 for temperature control. Accordingly, in the vertically oriented portion R1, the heat transfer in the vertical direction, which is the orientation direction of the vertically oriented graphene structures 141a, is promoted. In other words, the heat transfer performance between the electrode plate 120 whose temperature varies due to the heat input from the plasma and the coolant flow passage 131 and the heating module 132 can be improved, and the temperature of the electrode plate 120 can be appropriately controlled.

Specifically, the present inventors have studied and found that the electrode plate 120 can be cooled more effectively compared to when the heat transfer sheet 140' formed by laminating the plurality of graphite sheets 141 in the vertical direction is inserted between the electrode plate 120 and the metal plate 130, as shown in FIG. 7. They also have found that the effect of cooling the electrode plate 120 is further improved especially when the RF power is applied with a high output during plasma processing.

In other words, by inserting the heat transfer sheet 140 having the vertically oriented portion R1 between the electrode plate 120 and the metal plate 130, the efficiency of cooling the electrode plate 120 is increased. As a result, in the plasma processing apparatus, the electrode plate 120 can be appropriately cooled even when the high-speed switching of the RF power source is performed with a high output.

Further, in accordance with the present embodiment, as shown in FIG. 2, the coolant flow passage 131 and the heating module 132 are arranged in the metal plate 130 without overlapping in the vertical direction. Accordingly, for example, when the heat transfer fluid circulates in the coolant flow passage 131 to cool the electrode plate 120, the interference of the heating module 132 with the heat transfer between the electrode plate 120 and the coolant flow passage 131 is suppressed. In other words, the electrode plate 120 can be cooled more appropriately.

In the above embodiment, the heat transfer sheet 140 inserted between the electrode plate 120 and the metal plate 130 of the upper electrode assembly 13 is formed by laminating the plurality of vertically oriented graphite sheets 141 in the plane (horizontal) direction, for example. Accordingly, in the heat transfer sheet 140, the thermal conductivity in the vertical direction (Z-direction in FIG. 4) and one plane direction (X-direction in FIG. 4) is higher than the thermal conductivity in the other plane direction (Y-direction in FIG. 4).

Figure 8:
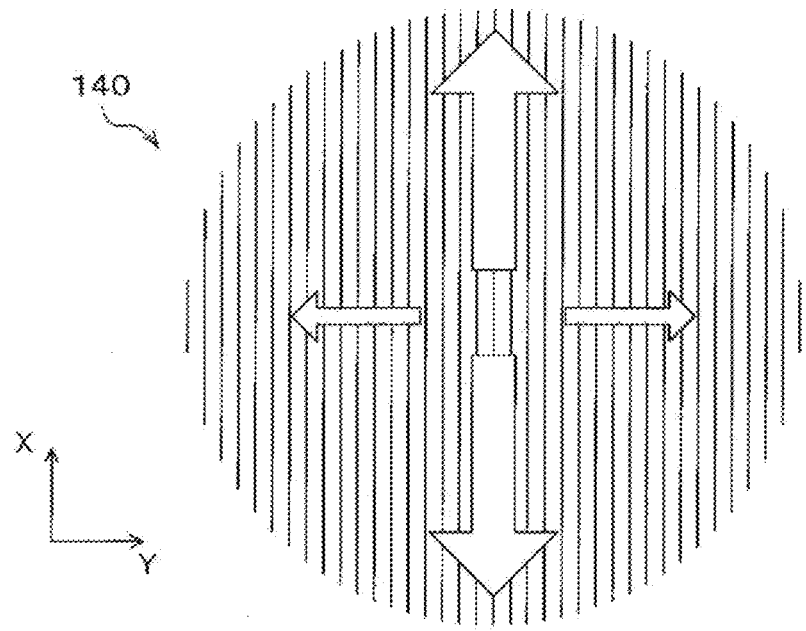
FIG. 8 explains in-plane temperature non-uniformity on an electrode plate.

Here, it is known that in general plasma processing performed by the plasma processing apparatus 1, the heat input from the plasma is higher on the center side (radially inner side) of the electrode plate 120 than on the edge side (radially outer side) thereof. Therefore, the temperature variation of the electrode plate 120 due to the heat input from the plasma tends to be greater on the center side than on the edge side. In other words, the temperature on the center side tends to be higher than the temperature on the edge side. Hence, when the heat transfer sheet 140 is inserted between the electrode plate 120 and the metal plate 130, the amount of heat transfer from the center side to the edge side of the heat transfer sheet 140 becomes non-uniform in one plane direction (X-direction) and the other plane direction (Y-direction) as shown in FIG. 8. As a result, it may be difficult to control the cooling of the electrode plate 120 to be uniform especially in a circumferential direction.

Figure 9A:
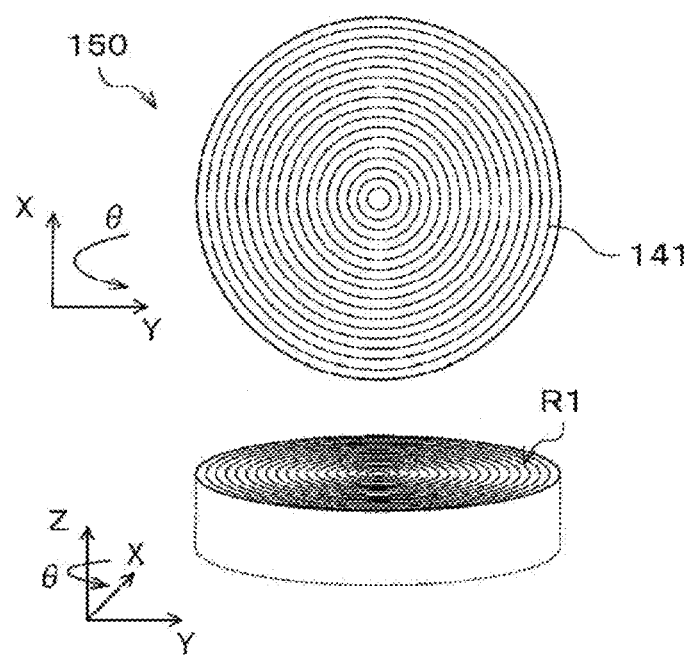
FIG. 9A explains another configuration example of the heat transfer sheet.

Therefore, in the upper electrode assembly 13, as shown in FIG. 9A, a heat transfer sheet 150 having the vertically oriented portion R1 formed by concentrically arranging the plurality of vertically oriented graphite sheets 141 may be inserted between the electrode plate 120 and the metal plate 130. Further, the vertically oriented carbon nanotube sheet 142 having at least one vertically oriented carbon nanotube 142a may be disposed at the center of the plurality of vertically oriented graphite sheets 141 concentrically arranged.

In accordance with the heat transfer sheet 150 shown in FIG. 9A, the thermal conductivity in the vertical direction (Z-direction) and the circumferential direction (θ-direction) of the heat transfer sheet 150 is higher than the thermal conductivity in the radial direction (X-direction and Y-direction) of the heat transfer sheet 150. Accordingly, the amount of heat transfer in the circumferential direction of the heat transfer sheet 150 becomes greater than the amount of heat transfer in the radial direction thereof. As a result, the temperature of the electrode plate 120 can be controlled to be uniform especially in the circumferential direction.

Figure 9B:
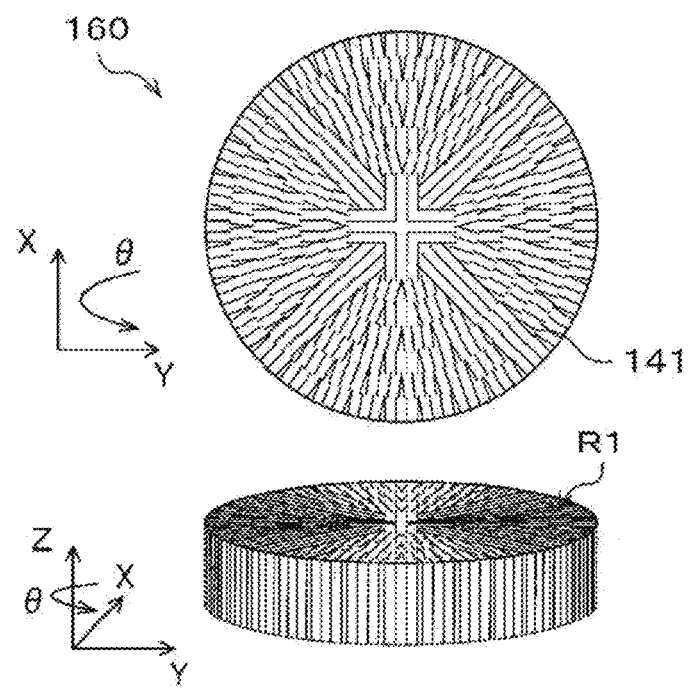
FIG. 9B explains yet another configuration example of the heat transfer sheet.

Further, in the upper electrode assembly 13, as shown in FIG. 9B, a heat transfer sheet 160 having the vertically oriented portion R1 formed by arranging the plurality of vertically oriented graphite sheets 141 along the radial direction, i.e., in a radial shape, may be inserted between the electrode plate 120 and the metal plate 130.

In accordance with the heat transfer sheet 160 shown in FIG. 9B, the thermal conductivity in the vertical direction (Z-direction) and the radial direction (X-direction and Y-direction) of the heat transfer sheet 160 is higher than the thermal conductivity in the circumferential direction (θ-direction) of the heat transfer sheet 160. Further, in accordance with the heat transfer sheet 160, it is possible to control the amount of heat transfer from the center side to the edge side of the heat transfer sheet 160 to be uniform in one plane direction (X-direction) and the other plane direction (Y-direction). As a result, the temperature of the electrode plate 120 can be controlled to be uniform in the circumferential direction, and the heat input from the plasma to the center side of the heat transfer sheet 160 can be processed toward the edge side thereof. In other words, the temperature on the center side and the edge side can be controlled to be uniform. That is, the temperature of the electrode plate 120 can be controlled to be uniform in the plane.

In the above embodiment, the case where the heat transfer sheet 140 having only the vertically oriented portion R1 is inserted between the electrode plate 120 and the metal plate 130 has been described as an example. However, the configuration of the heat transfer sheet is not limited thereto. Specifically, the heat transfer sheet having, in addition to the vertically oriented portion R1, the portion in which the plurality of graphene structures 141a are oriented along the plane (horizontal) direction may be inserted between the electrode plate 120 and the metal plate 130, depending on the heat removal design of the electrode plate 120 to be cooled. The portion in which the plurality of graphene structures 141a are oriented along the plane (horizontal) direction may be referred to as "horizontally oriented portion R2" (see FIGS. 10A and 10B). Further, the graphene structures 141a oriented along the plane (horizontal) direction constitute "horizontally oriented graphene structures" of the present disclosure. In other words, in the horizontally oriented portion R2, the thermal conductivity in the plane (horizontal) direction is higher than the thermal conductivity in the vertical direction.

FIG. 10 explains a schematic configuration of a heat transfer sheet 170 according to an embodiment that has the vertically oriented portion R1 and the horizontally oriented portion R2.

Figure 10A:
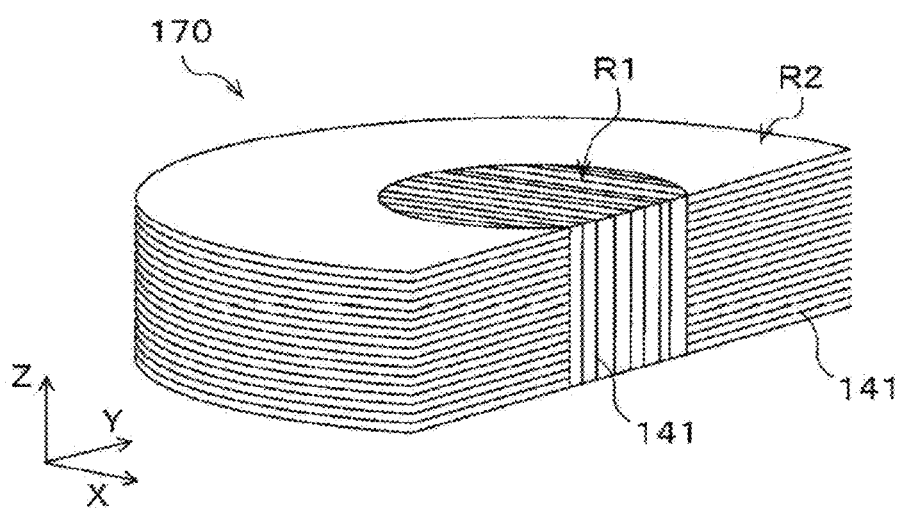
FIG. 10A explains yet another configuration example of the heat transfer sheet.

As shown in FIG. 10A, in one embodiment, the heat transfer sheet 170 has the vertically oriented portion R1, which is disposed on the center side of the heat transfer sheet 170 and formed in a substantially circular shape in plan view, and the horizontally oriented portion R2, which is disposed on the edge side of the heat transfer sheet 170 and formed in a substantially annular shape in plan view. In other words, the vertically oriented portion R1 and the horizontally oriented portion R2 of the heat transfer sheet 170 are arranged side by side (side by side in the planar (horizontal) direction) between the electrode plate 120 and the metal plate 130 at the same height in the vertical direction.

In accordance with the heat transfer sheet 170 shown in FIG. 10A, in the vertically oriented portion R1 on the center side, the thermal conductivity in the vertical direction (Z-direction) and one plane direction (X-direction) is higher than the thermal conductivity in the other plane direction (Y-direction). On the other hand, in the horizontally oriented portion R2 on the edge side, the thermal conductivity in the plane directions (X-direction and Y-direction) is higher than the thermal conductivity in the vertical direction (Z-direction).

As described above, in the general plasma processing performed by the plasma processing apparatus 1, the temperature tends to be higher on the center side of the electrode plate 120 than on the edge side thereof. Therefore, in the heat transfer sheet 170, as shown in FIG. 10A, the vertically oriented portion R1 having a high thermal conductivity in the vertical direction is disposed on the center side where the temperature of the electrode plate 120 is relatively high, and the horizontally oriented portion R2 having a high thermal conductivity in the plane (horizontal) direction is disposed on the edge side where the temperature is relatively low. Accordingly, on the center side of the electrode plate 120, the heat transfer in the vertical direction is promoted to lower the temperature, and on the edge side of the electrode plate 120, the heat transfer in the plane (horizontal) direction is promoted to improve the temperature uniformity.

As described above, in the upper electrode assembly 13, the temperature of the electrode plate 120 can be appropriately controlled by appropriately arranging the vertically oriented portion R1 and the horizontally oriented portion R2 depending on the in-plane distribution of the temperature variation of the electrode plate 120 due to the heat input from the plasma. Specifically, the vertically oriented portion R1 is correspondingly disposed to the portion where the temperature of the electrode plate 120 is relatively high to thereby promote the cooling, and the horizontally oriented portion R2 is correspondingly disposed to the portion where the temperature of the electrode plate 120 is relatively low to thereby improve the in-plane temperature uniformity. In that case, the amount of heat transfer in the vertical direction from the electrode plate 120, i.e., the temperature of the electrode plate 120, can be controlled by changing the area of the vertically oriented portion R1 depending on the temperature variation of the electrode plate 120, for example.

In the example shown in FIG. 10A, the vertically oriented portion R1 is formed by horizontally laminating the plurality of vertically oriented graphite sheets 141. However, the vertically oriented portion R1 may be formed by laminating the plurality of vertically oriented graphite sheets 141 concentrically or radially as shown in FIGS. 9A and 9B. Further, as shown in FIG. 10B, for example, the vertically oriented portion R1 may be formed by the vertically oriented carbon nanotube sheet 142 having the plurality of vertically oriented carbon nanotubes 142a extending in the vertical direction.

Figure 10B:
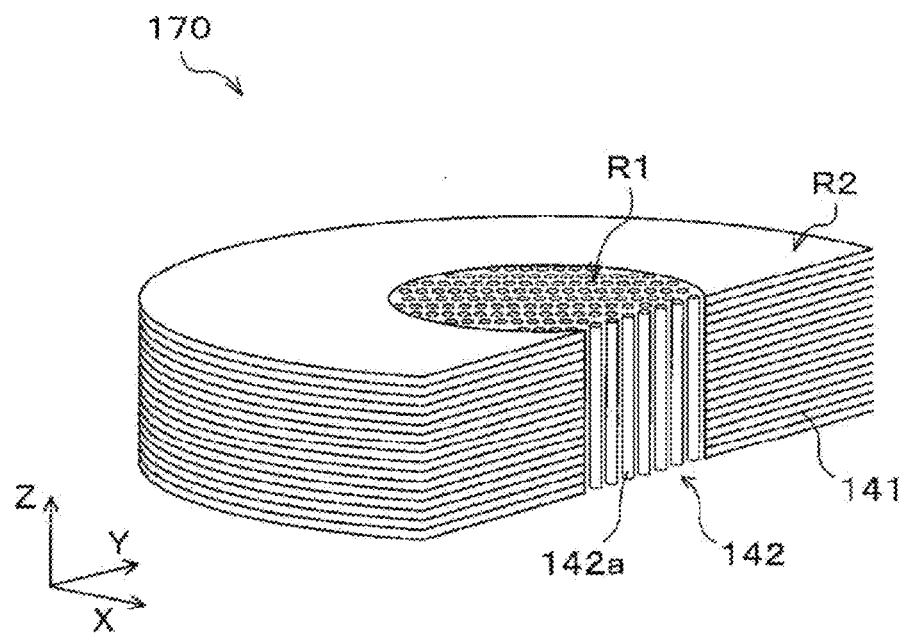
FIG. 10B explains yet another configuration example of the heat transfer sheet.

Further, in the examples shown in FIGS. 10A and 10B, the horizontally oriented portion R2 is formed by horizontally laminating the plurality of horizontally oriented graphite sheets 141. However, the horizontally oriented portion R2 may be formed (not shown) by the horizontally oriented carbon nanotube sheet 142 having the plurality of horizontally oriented carbon nanotubes 142a extending in the plane (horizontal) direction.

Figure 11:
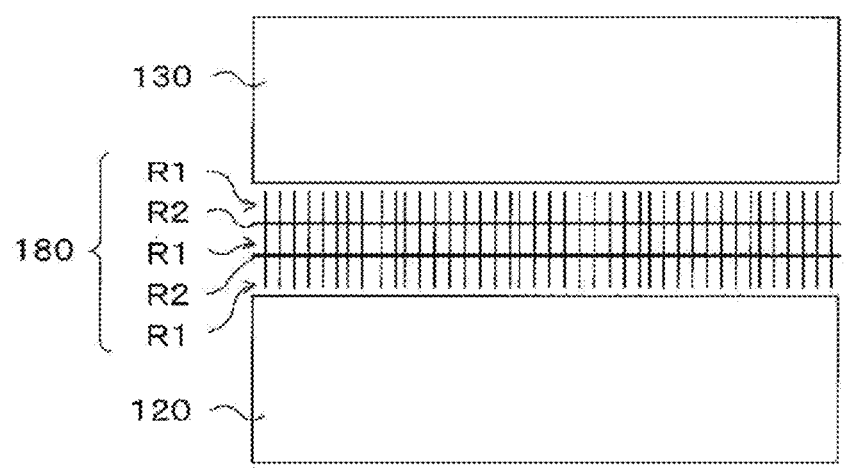
FIG. 11 explains yet another configuration example of the heat transfer sheet.

In order to improve the in-plane temperature uniformity of the electrode plate 120, the vertically oriented portion R1 and the horizontally oriented portion R2 may be laminated when viewed from a side, as in the heat transfer sheet 180 shown in FIG. 11. In other words, the heat transfer sheet 180 may further include, in addition to the vertically oriented portion R1, the horizontally oriented portion R2 disposed between the electrode plate 120 and the vertically oriented portion R1, between the metal plate 130 and the vertically oriented portion R1, or between the vertically oriented portions R1.

In accordance with the heat transfer sheet 180 shown in FIG. 11, in the vertically oriented portions R1 that are laminated in the vertical direction, the cooling of the electrode plate 120 is promoted by promoting the heat transfer in the vertical direction is promoted. On the other hand, in the horizontally oriented portions R2 that are laminated in the vertical direction, the in-plane temperature uniformity of the electrode plate 120 is improved by promoting the heat transfer in the plane (horizontal) direction. In other words, by combining the vertically oriented portions R1 and the horizontally oriented portions R2 in multiple layers, the thermal conductivity in each of the vertical direction and the plane (horizontal) direction can be increased. In other words, the cooling of the electrode plate 120 can be effectively and uniformly performed.

In order to effectively, i.e., quickly, cool the electrode plate 120, it is preferable to minimize the thickness of the horizontally oriented portions R2 that are laminated compared to the thickness of the vertically oriented portions R1.

<Upper Electrode Assembly According to a Second Embodiment>

In the above embodiment, the case where the upper electrode assembly 13 includes the electrode plates 120, the heat transfer sheet, and the metal plate 130 that are laminated horizontally has been described as an example. However, the configuration of the upper electrode assembly disposed in the plasma processing apparatus 1 is not limited thereto.

Figure 12:
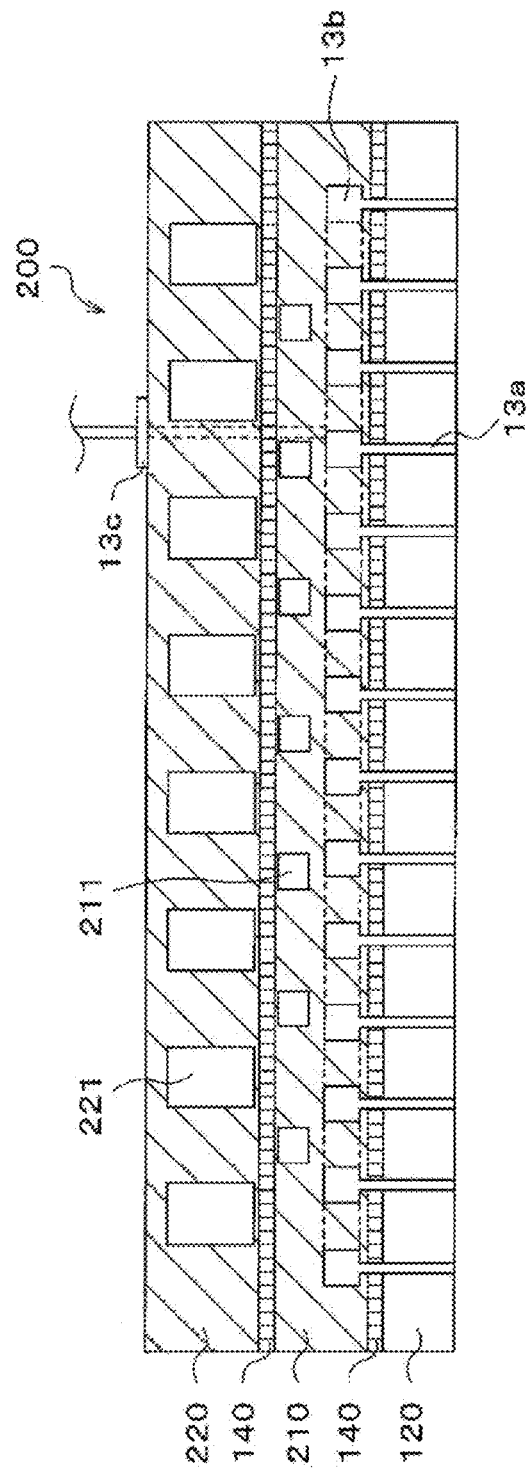
FIG. 12 is a vertical cross-sectional view showing a configuration of an upper electrode assembly according to a second embodiment.

FIG. 12 is a vertical cross-sectional view showing a schematic configuration of the upper electrode assembly 200 according to a second embodiment.

As shown in FIG. 12, in one embodiment, the upper electrode assembly 200 includes the electrode plate 120, the metal plate 210, and an additional metal plate 220. The electrode plate 120 and the metal plate 210 are laminated in the vertical direction with the heat transfer sheet 140 interposed therebetween. Further, the metal plate 210 and the additional metal plates 220 are laminated in the vertical direction with the heat transfer sheet 140 interposed therebetween. In other words, the upper electrode assembly 200 is formed by laminating the electrode plate 120, the heat transfer sheet 140, the metal plate 210, the heat transfer sheet 140, and the additional metal plates 220 in that order from the plasma processing space 10s side.

The heat transfer sheet inserted between the electrode plate 120 and the metal plate 210 is not limited to the heat transfer sheet 140 shown in FIGS. 3 and 4, and at least one of the heat transfer sheets 150, 160, 170 or 180 shown in FIGS. 8 to 11 may be used appropriately. Further, the heat transfer sheet inserted between the metal plate 210 and the additional metal plate 220 is not limited to the heat transfer sheet 140, and at least one of the heat transfer sheets 150, 160, 170 or 180 may be used appropriately.

Further, the heat transfer sheet inserted between the electrode plate 120 and the metal plate 210 and the heat transfer sheet inserted between the metal plate 210 and the additional metal plate 220 may have the same structure, or may have different structures.

In the present embodiment, the heat transfer sheet inserted between the metal plate 210 and the additional metal plate 220 constitutes "an additional heat transfer sheet" of the present disclosure. Further, the vertically oriented portion R1 and the horizontally oriented portion R2 of the additional heat transfer sheet constitute "an additional vertically oriented portion" and "an additional horizontally oriented portion" of the present disclosure. Similarly, the graphene structures 141a of the additional vertically oriented portion and the additional horizontally oriented portion constitute "additional vertically oriented graphene structures" and "additional horizontally oriented graphene structures" of the present disclosure. Similarly, when the additional heat transfer sheet has the graphite sheets 141 or the carbon nanotubes 142, the graphite sheets 141 or the carbon nanotubes 142 constitute "additional graphite sheets" and "additional carbon nanotubes" of the present disclosure.

The electrode plate 120 has the same configuration as that of the electrode plate 120 of the upper electrode assembly 13 according to the first embodiment. In other words, the electrode plate 120 includes the conductive member functioning as the upper electrode, and the plurality of gas inlet ports 13a are formed through the electrode plate 120 in the thickness direction.

The metal plate 210 is laminated on the electrode plate 120, and functions as a support for the electrode plate 120. At least one gas diffusion space 13b is formed in the metal plate 210.

Further, the metal plate 210 has therein at least one heating module 211 configured to control the electrode plate 120 whose temperature varies due to the heat input from the plasma to a target temperature. The heating module 211 may be a heater, a heat transfer medium, a flow passage, or any combination thereof.

The additional metal plate 220 is laminated on the metal plate 210, and function as a support for the electrode plate 120 while being integrated with the metal plate 210. At least one gas supply port 13c is formed at the additional metal plate 220.

Further, the additional metal plate 220 has therein at least one coolant flow passage 221 configured to control the electrode plate 120 whose temperature varies due to the heat input from the plasma to a target temperature. A heat transfer fluid such as brine or gas flows in the coolant flow passage 221.

Further, in one embodiment, the coolant flow passage 221 formed in the additional metal plate 220 and the heating module 211 disposed in the metal plate 210 are arranged without overlapping in the vertical direction (in plan view).

The heat transfer sheet inserted between the electrode plate 120 and the metal plate 210, or the heat transfer sheet inserted between the metal plate 210 and the additional metal plate 220 may have any configuration depending on the heat removal design corresponding to the temperature control of the electrode plate 120, as described above. In other words, the heat transfer sheet inserted between the electrode plate 120 and the metal plate 210 and between the metal plate 210 and the additional metal plate 220 may have only the vertically oriented portion R1 or may further have the horizontally oriented portion R2. Further, the arrangement of the vertically oriented portion R1 and the horizontally oriented portion R2 may be randomly selected.

The upper electrode assembly 200 according to the second embodiment is configured as described above. Even when the upper electrode assembly is formed by laminating the plurality of metal plates, the temperature of the electrode plate 120 can be appropriately controlled by arranging the heat transfer sheets of the present disclosure on the interfaces of the metal plates.

The embodiments of the present disclosure are illustrative in all respects and are not restrictive. The above-described embodiments may be omitted, replaced, or changed in various forms without departing from the scope of the appended claims and the gist thereof.

For example, in the above embodiments, the case where the heat transfer sheet having the plurality of graphene structures oriented in the lamination direction is inserted between the electrode plate and the metal plate constituting the upper electrode assembly has been described as an example. However, the member using the heat transfer sheet is not limited to the upper electrode assembly, and the heat transfer sheet may be used for any member that requires effective heat treatment. Specifically, for example, in the substrate support 11, the heat transfer sheet may be inserted between the base 113 and the electrostatic chuck 114.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. An upper electrode assembly used in a plasma processing apparatus, the upper electrode assembly comprising:
   an electrode plate;
   a metal plate; and
   a heat transfer sheet disposed between the electrode plate and the metal plate, the heat transfer sheet having a vertically oriented portion, wherein
   the vertically oriented portion includes a plurality of nanotubes extending along a vertical direction,
   each nanotube, of the plurality of nanotubes, has a plurality of graphene sheets, and
   each graphene sheet is normal to a horizontal direction.

2. The upper electrode assembly of claim 1, wherein the plurality of vertically oriented nanotubes are carbon nanotubes.

3. The upper electrode assembly of claim 1, wherein the plurality of graphene sheets are laminated along the horizontal direction.

4. The upper electrode assembly of claim 1, wherein
   the heat transfer sheet further includes a horizontally oriented portion,
   the horizontally oriented portion includes a plurality of horizontally oriented graphene structures oriented along the horizontal direction, and
   the vertically oriented portion and the horizontally oriented portion are laminated along the vertical direction.

5. The upper electrode assembly of claim 4, wherein the horizontally oriented portion has a plurality of horizontally oriented carbon nanotubes oriented along the horizontal direction.

6. The upper electrode assembly of claim 4, wherein
the each of the plurality of graphene structures is a graphene sheet, and
the plurality of horizontally oriented graphene structures is laminated in the vertical direction.

7. The upper electrode assembly of claim 1, wherein
the heat transfer sheet further includes a horizontally oriented portion,
the horizontally oriented portion includes a plurality of horizontally oriented graphene structures oriented along the horizontal direction, and
the vertically oriented portion and the horizontally oriented portion are arranged along the horizontal direction.

8. The upper electrode assembly of claim 1, wherein the metal plate has at least one coolant flow passage, at least one gas diffusion space, and at least one heating module.

9. The upper electrode assembly of claim 8, wherein said at least one heating module is disposed so as not to overlap said at least one coolant flow passage.

10. The upper electrode assembly of claim 1, further comprising:
an additional metal plate; and
an additional heat transfer sheet disposed between the metal plate and the additional metal plate and having an additional vertically oriented portion, wherein
the additional vertically oriented portion includes a plurality of additional nanotubes extending along the vertical direction.

11. The upper electrode assembly of claim 10, wherein
the metal plate has therein at least one gas diffusion space,
the additional metal plate has therein at least one coolant flow passage, and
at least one of the metal plate or the additional metal plate has therein at least one heating module.

12. The upper electrode assembly of claim 11, wherein said at least one heating module is disposed so as not to vertically overlap said at least one coolant flow passage.

13. The upper electrode assembly of claim 10, wherein
the additional heat transfer sheet has an additional horizontally oriented portion having a plurality of additional horizontally oriented graphene structures oriented along the horizontal direction, and
the additional vertically oriented portion and the additional horizontally oriented portion are laminated in the vertical direction.

14. The upper electrode assembly of claim 13, wherein the additional horizontally oriented portion has a plurality of additional horizontally oriented carbon nanotubes oriented along the horizontal direction, and each of the plurality of additional horizontally oriented carbon nanotubes has the plurality of additional horizontally oriented graphene structures.

15. The upper electrode assembly of claim 13, wherein the additional horizontally oriented portion has a plurality of additional horizontally oriented graphite sheets that are laminated in the vertical direction, and each of the plurality of additional horizontally oriented graphite sheets has the plurality of additional horizontally oriented graphene structures.

16. The upper electrode assembly of claim 10, wherein
the additional heat transfer sheet has an additional horizontally oriented portion having a plurality of additional horizontally oriented graphene structures oriented along the horizontal direction, and
the additional vertically oriented portion and the additional horizontally oriented portion are arranged along the horizontal direction.

* * * * *